(12) United States Patent
Gottscho et al.

(10) Patent No.: US 6,632,322 B1
(45) Date of Patent: Oct. 14, 2003

(54) SWITCHED UNIFORMITY CONTROL

(75) Inventors: Richard A. Gottscho, Pleasanton, CA (US); Robert J. Steger, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/607,599

(22) Filed: Jun. 30, 2000

(51) Int. Cl.[7] ............................. C23C 16/00; C23F 1/00
(52) U.S. Cl. ............................. 156/345.33; 156/345.34; 156/345.48; 118/715; 118/723 R; 118/723 I
(58) Field of Search ..................... 156/345, 345.33, 156/345.34, 345.41, 345.43, 345.47, 345.48; 118/715, 723 R, 723 E, 723 I, 723 AN, 723 MW

(56) References Cited

U.S. PATENT DOCUMENTS

| | | |
|---|---|---|
| 3,569,777 A | 3/1971 | Beaudry |
| 4,207,137 A | 6/1980 | Tretola |
| 4,948,458 A | 8/1990 | Ogle |
| 4,989,544 A | 2/1991 | Yoshikawa |
| 4,990,229 A | 2/1991 | Campbell et al. |
| 5,018,479 A | 5/1991 | Markunas et al. |
| 5,091,049 A | 2/1992 | Campbell et al. |
| 5,122,251 A | 6/1992 | Campbell et al. |
| 5,401,350 A | 3/1995 | Patrick et al. |
| 5,421,891 A | 6/1995 | Campbell et al. |
| 5,429,070 A | 7/1995 | Campbell et al. |
| 5,450,205 A | 9/1995 | Sawin et al. |
| 5,522,934 A | 6/1996 | Suzuki et al. |
| 5,571,366 A | 11/1996 | Ishii et al. |
| 5,578,165 A | 11/1996 | Patrick et al. |
| 5,587,038 A | 12/1996 | Cecchi et al. |
| 5,587,205 A | 12/1996 | Saito et al. |
| 5,635,409 A | 6/1997 | Moslehi |
| 5,637,961 A | 6/1997 | Ishii et al. |
| 5,683,548 A | 11/1997 | Hartig et al. |
| 5,707,452 A | 1/1998 | Dandl |
| 5,744,049 A | 4/1998 | Hills et al. |
| 5,795,451 A | 8/1998 | Tan et al. |
| 5,810,932 A | 9/1998 | Ueda et al. |
| 5,919,382 A | 7/1999 | Qian et al. |
| 5,928,428 A * | 7/1999 | Horie .................... 118/724 |
| 5,938,883 A | 8/1999 | Ishii et al. |
| 5,976,261 A * | 11/1999 | Moslehi et al. .......... 118/719 |
| 5,976,327 A | 11/1999 | Tanaka |
| 5,980,687 A | 11/1999 | Koshimizu |
| 5,983,828 A | 11/1999 | Savas |
| 6,009,830 A | 1/2000 | Li et al. |
| 6,042,687 A | 3/2000 | Singh et al. |

(List continued on next page.)

FOREIGN PATENT DOCUMENTS

| | | |
|---|---|---|
| EP | 0792947 | 9/1997 |
| EP | 0838843 | 4/1998 |
| JP | 09139380 | 5/1997 |

OTHER PUBLICATIONS

Patent Abstract of Japan, vol. 012, No. 132 (C–490), 22, Apr. 1988.

*Primary Examiner*—Luz L. Alejandro
(74) *Attorney, Agent, or Firm*—Beyer Weaver & Thomas LLP

(57) ABSTRACT

A component delivery mechanism for distributing a component inside a process chamber is disclosed. The component is used to process a work piece within the process chamber. The component delivery mechanism includes a plurality of component outputs for outputting the component to a desired region of the process chamber. The component delivery mechanism further includes a spatial distribution switch coupled to the plurality of component outputs. The spatial distribution switch is arranged for directing the component to at least one of the plurality of component outputs. The component delivery mechanism also includes a single component source coupled to the spatial distribution switch. The single component source is arranged for supplying the component to the spatial distribution switch.

30 Claims, 6 Drawing Sheets

U.S. PATENT DOCUMENTS

| | | |
|---|---|---|
| 6,051,114 A | 4/2000 | Yao et al. |
| 6,071,572 A | 6/2000 | Mosely et al. |
| 6,096,160 A | 8/2000 | Kadomura |
| 6,113,731 A | 9/2000 | Shan et al. |
| 6,132,515 A * | 10/2000 | Gauthier ..................... 118/715 |
| 6,132,552 A | 10/2000 | Donohoe et al. |
| 6,178,920 B1 | 1/2001 | Ye et al. |
| 6,178,925 B1 * | 1/2001 | Sturm et al. ................ 122/390 |
| 6,189,482 B1 * | 2/2001 | Zhao et al. ............. 118/723 R |
| 6,196,155 B1 | 3/2001 | Setoyama et al. |

\* cited by examiner

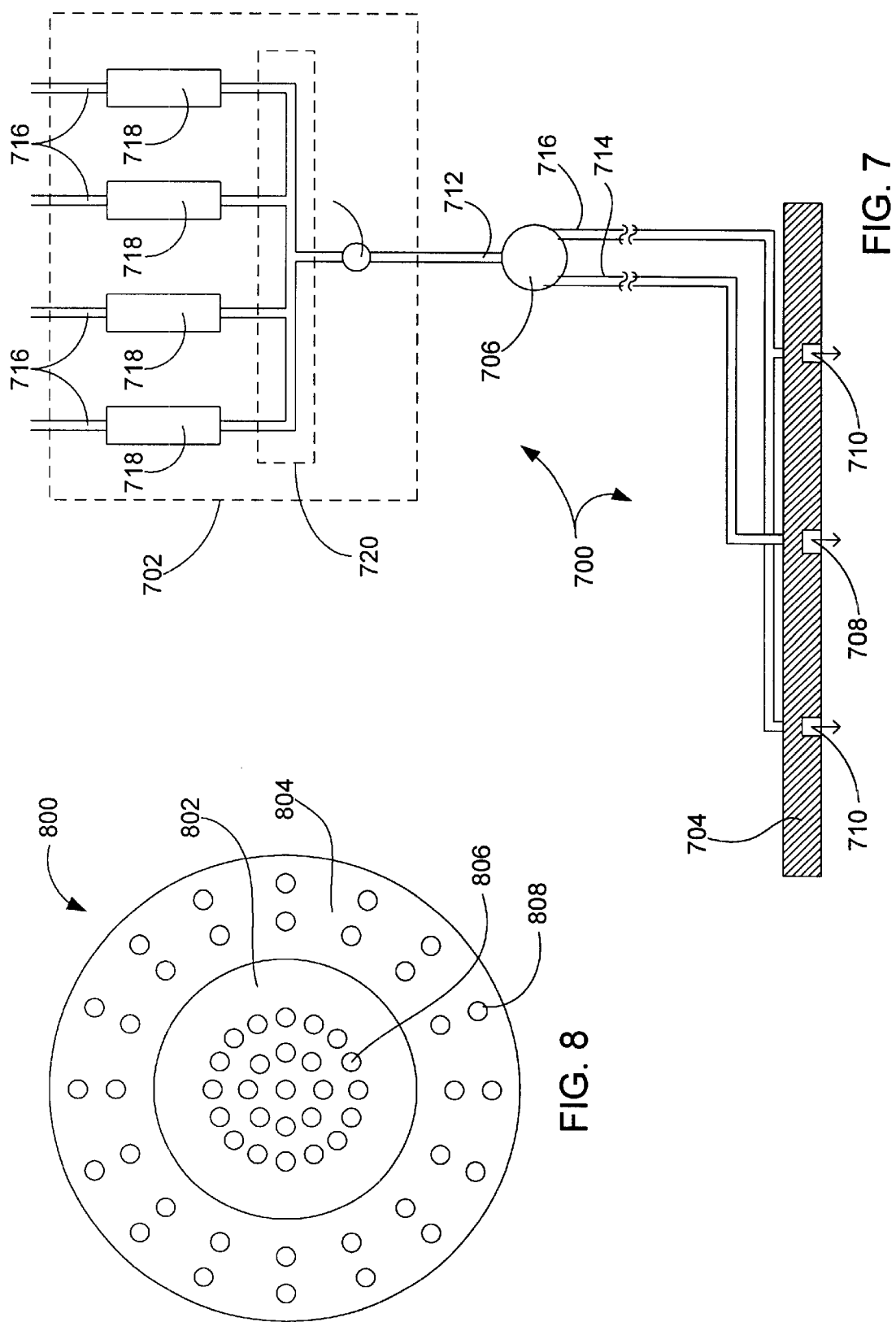

SWITCHED UNIFORMITY CONTROL

BACKGROUND OF THE INVENTION

The present invention relates to apparatus and methods for processing substrates such as semiconductor substrates for use in IC fabrication or glass panels for use in flat panel display applications. More particularly, the present invention relates to improved processing systems that are capable of processing substrates with a high degree of processing uniformity across the substrate surface.

During the manufacture of a semiconductor-based product, for example, a flat panel display or an integrated circuit, multiple deposition and/or etching steps may be employed on the surface of a substrate to form devices such as transistors, capacitors, resistors, interconnects and the like. During deposition, successive layers of various materials are deposited on the surface of the substrate to form a layer stack. For example, layers of insulator, conductor and semiconductor may be formed on the surface of the substrate. Conversely, etching may be employed to selectively remove materials from predefined areas of the substrate, and more particularly the layer stack. For example, etched features such as vias, contacts, or trenches may be formed in the layers of the substrate.

Etching and depositing processes and their associated reactors have been around for some time. For example, deposition processes including chemical vapor deposition (CVD), thermal CVD, plasma enhanced chemical vapor deposition (PECVD), physical vapor deposition (PVD) such as sputtering and the like, as well as, etching processes including those adapted for dry etching, plasma etching, reactive etching (RIE), magnetically enhanced reactive ion etching (MERIE), electron cyclotron resonance (ECR), and the like, have been introduced and employed to various degrees to process semiconductor substrates and display panels.

In processing substrates, one of the most important parameters that engineers strive to improve is process uniformity. In the etch environment, for example, etch uniformity is an important determinant of uniform device performance and device yield, i.e., a high level of etch uniformity tends to improve the percentage of defect-free processed substrates, which translates into lower cost for the manufacturer. As the term is employed herein, etch uniformity refers to the uniformity of the entire etch process across the substrate surface including etch rate, microloading, mask selectivity, underlayer selectivity, critical dimension control, and profile characteristics like sidewall angle and roughness. If the etch is highly uniform, for example, it is expected that etch rates at different points on the substrate tend to be substantially equal. In this case, it is less likely that one area of the substrate will be unduly over-etched while other areas remain inadequately etched. Although not specifically described, it should be understood that deposition uniformity is similar to etch uniformity in that it is also an important determinant of uniform device performance and device yield.

In addition, in many applications these stringent processing requirements may be contradictory at different stages during the substrate processing. Often this is due to the presence of multiple layers that must be processed with dramatically different processing requirements. For example, etch recipes including power, temperature, pressure, gas chemistry, and gas flow may be required to dramatically change while processing a single substrate to achieve the desired processing performance. Furthermore, because of the nature of the processes, material may accumulate on surrounding surfaces, i.e., chamber walls, and as a result the process may drift.

In addition to processing uniformity, there also exist other issues of concern to the semiconductor industry. Among the important issues to manufacturers is the cost of ownership of the processing tool, which includes, for example, the cost of acquiring and maintaining the system, the frequency of chamber cleaning required to maintain an acceptable level of processing performance, the longevity of the system components and the like. Thus a desirable process is often one that strikes the right balance between the different cost-of-ownership and process parameters in such a way that results in a higher quality process at a lower cost. Further, as the features on the substrate become smaller and the process becomes more demanding (e.g., smaller critical dimensions, higher aspect ratios, faster throughput, and the like), process engineers are constantly searching for new methods and apparatuses to achieve higher quality processing results at lower costs.

In view of the foregoing, there are desired improved techniques for producing uniform processing at the surface of the substrate.

SUMMARY OF THE INVENTION

The invention relates, in one embodiment, to a component delivery mechanism for distributing a component inside a process chamber. The component is used to process a work piece within the process chamber. The component delivery mechanism includes a plurality of component outputs for outputting the component to a desired region of the process chamber. The component delivery mechanism further includes a spatial distribution switch coupled to the plurality of component outputs. The spatial distribution switch is arranged for directing the component to at least one of the plurality of component outputs. The component delivery mechanism also includes a single component source coupled to the spatial distribution switch. The single component source is arranged for supplying the component to the spatial distribution switch.

The invention relates, in another embodiment, to a method for processing a work piece with a component of a process recipe. The method includes providing a process chamber within which the work piece is processed, and which includes at least a first processing zone and a second processing zone. Each zone represents a portion of the work piece to be processed. The method further includes outputting the component into the first processing zone of the process chamber. The method additionally includes switching from the first processing zone to the second processing zone. The method also includes outputting the component into the second processing zone of the process chamber.

The invention relates, in another embodiment, to a spatially controlled plasma reactor for processing a substrate. The reactor includes a process chamber within which a plasma is both ignited and sustained for the processing. The reactor further includes a power delivery mechanism having a single power source and an electrode coupled to the power source through a power distribution switch. The single power source is for generating energy sufficiently strong to ignite and sustain the plasma. The electrode includes a first coil and a second coil. The first coil is arranged to produce an electric field inside a first power region of the process chamber and the second coil is arranged to produce an electric field inside a second power region of the process chamber. Furthermore, the power distribution switch is arranged for directing the energy of the power source between the inner and outer coils. The reactor additionally includes a gas delivery mechanism having a single gas source, a first gas injection port, a second gas injection port and a gas distribution switch. The single gas source is for generating a process gas, which is used in part to form the plasma and to process the substrate. The first gas injection port is coupled to the gas source through the gas distribution switch, and is arranged to release the process gas into a first gas region of the process chamber. The second gas injection port is also coupled to the gas source through the gas distribution switch, and is arranged to release the process gas into a second gas region of the process chamber. Furthermore, the gas distribution switch is arranged for directing the process gas of the gas source between the inner and outer gas injection ports.

The invention relates, in another embodiment, to a component delivery mechanism for distributing a component inside a process chamber. The component is used to process a work piece within the process chamber. The component delivery mechanism includes a single component source for supplying the component. The component delivery mechanism further includes a spatial distribution switch having a component input for receiving the component from the single component source, and a plurality of component outputs for distributing the component. The spatial distribution switch is arranged to direct the received component between one or more of the plurality of component outputs.

DESCRIPTION OF THE DRAWINGS

The present invention is illustrated by way of example, and not by way of limitation, in the figures of the accompanying drawings and in which like reference numerals refer to similar elements and in which:

FIG. 7 is a diagram of a gas delivery mechanism, in accordance with one embodiment of the present invention.

FIG. 8 is a diagram of a gas distribution plate that may be used in the gas delivery mechanism of FIG. 7, in accordance with one embodiment of the present invention.

DETAILED DESCRIPTION OF THE INVENTION

Figure 1:
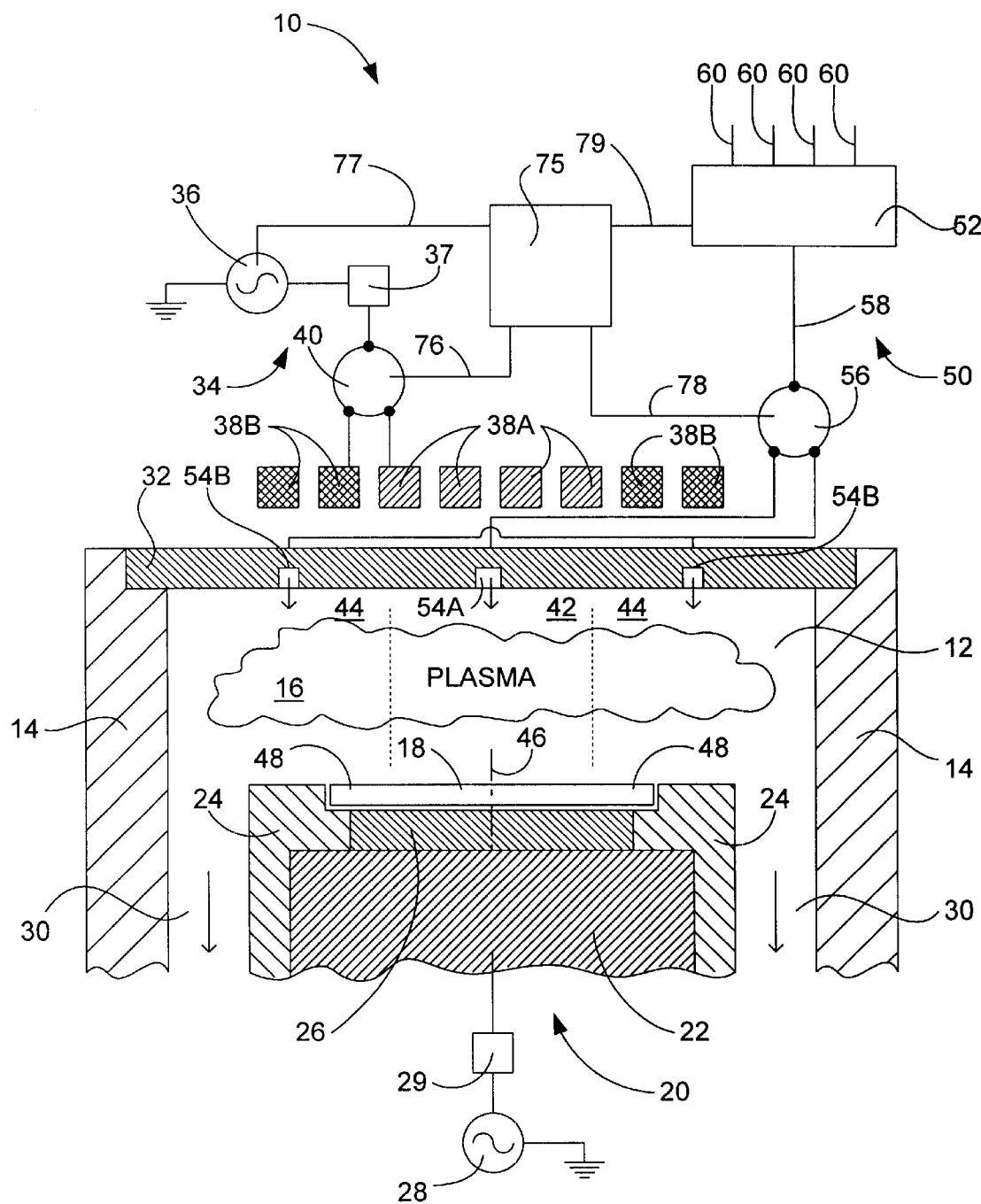
FIG. 1 is a plasma reactor, in accordance with one embodiment of the present invention.

The invention pertains to an improved method and apparatus for uniformly processing a substrate. The present invention achieves process uniformity by enhancing the control over the distribution of components used to form reactants, which process a substrate inside a process chamber. These components are generally part of a process recipe and may include power, gas flow, temperature and the like. The invention is particularly useful in plasma processing systems where both ions and neutrals (e.g., reactants) are used to process a substrate. One aspect of the invention relates to spatially separating the distribution of a component into multiple and independent zones within a process chamber. Another aspect of the invention relates to switching (or spatially modulating) the distribution of the component, which is supplied from a single source, between each of the independent zones. Another aspect of the invention relates to varying the magnitude of the component and/or the component constituents between each of the spatial zones. Yet another aspect of the invention relates to varying the time that the component spends at each of the independent zones.

The invention, relates in one embodiment, to a component delivery mechanism for distributing a component inside a process chamber. The system can be applied to a wide variety of components including power, gas flow, temperature and the like. As should be appreciated, the components may be used to form reactants, which process the substrate, or they may be used to control processing conditions, which enhance the process. In one implementation, the component delivery mechanism is arranged to change the amount of reactants formed in various regions of the process chamber. Accordingly, process uniformity can be achieved as a result of changing the amount of reactants inside the process chamber.

The component delivery mechanism generally includes a plurality of independent component outputs, a single component source, a spatial distribution switch, and a controller. The independent component outputs are configured for outputting the component into a desired region of a process chamber. For example, the independent component outputs could be configured for outputting the component the inner and outer region of the process chamber. As should be appreciated, the inner and outer regions may correspond to the center and edge of a substrate, respectively. The single component source is arranged for supplying the component to the independent component outputs. By single component source it is meant, that the component source has a single output for outputting the component. The component itself may not be singular and may consist of a variety of constituents. For example, in the case of a gas delivery mechanism, the component may consist of a plurality of gases that are premixed and outputted by a single gas supply source. The spatial distribution switch is disposed between the single source and independent component outputs, and is adapted to have multiple positions for directing the component to one of the plurality of independent component outputs. For example, a first position of the switch may direct the component to a first component output and a second position of the switch may direct the component to a second component output.

Furthermore, the controller is in communication with both the spatial switch and the single component source. One aspect of the controller is configured for selectively moving the spatial switch to each of its multiple positions. By selectively, it is meant that the controller is arranged to move the switch at certain times in the process, and to hold the switch at one of the independent component outputs for a predetermined duration. For example, in the case of gas flow, the gas flow may be allowed to flow to a first output at time, $T_1$, and a second output at time, $T_2$, and/or to flow for an extended or shortened amount of time to a first output as compared to a second output. Another aspect of the controller is configured for changing the magnitude of the component, the constituents of the component and the ratio of the constituents of the component. For example, in the case of gas flow, the flow rate of the released gas, as well as the flow ratios of the gas and constituents of the total flow, can be adjusted between each of the controlled switches.

In accordance with one aspect of the present invention, process uniformity is enhanced by varying the direction of the component and/or one or more of the parameters mentioned above to increase/reduce the amount of reactants or flux near the edge of a substrate relative to the center of the substrate during processing. In accordance with another aspect of the present invention, process uniformity is enhanced by varying the direction of the component and/or one or more of the parameters mentioned above to increase/ reduce the amount of reactants near the center of the substrate relative to the edge of the substrate during processing. These embodiments will be described in greater detail below.

In one embodiment, a plasma processing system that includes a spatial delivery system having a plurality of component delivery mechanisms is disclosed. The spatial delivery system is arranged to provide switched uniformity control. In general, a plasma is created by inputting a process gas into a process chamber, and then producing an electric field that accelerates the small number of electrons present inside the chamber causing them to collide with the gas molecules of the process gas. These collisions result in ionization and initiation of a discharge or plasma. As is well known in the art, the neutral gas molecules of the process gas when subjected to these strong electric fields lose electrons, and leave behind positively charged ions. As a result, positively charged ions, negatively charged electrons and neutral gas molecules are contained inside the process chamber. Correspondingly, the ions are made to accelerate towards the substrate where they, in combination with neutral species process the substrate. In the alternative, negative ions, made by electron attachment, can also be used to process the substrate. By way of example, processing may include etching, deposition and the like.

A well known problem in substrate processing systems is that spatially uniform processing is difficult to achieve, e.g., due to the reactant depletion between the reactant injection point and (across the substrate to) the pump opening; or due to the adsorption/desorption of reactants and products onto the chamber surfaces, which affect the substrate edges more so than the center. The spatial delivery system herein disclosed seeks to modify these inherently non-uniform effects by spatially altering the process conditions within the process chamber. Conventional technology includes approaches such as multiple power and gas injection zones. These designs use multiple sources (generators and gas delivery systems) which are quite costly. The method herein disclosed uses the simple method of single sources, but employs time multiplexing to create time slices, which are fed to multiple feed zones in the reactor.

The spatial delivery system is arranged to spatially separate the sources of both ions and neutrals within the chamber. For the ions, spatial separation can be accomplished by using a power delivery mechanism that produces an electric field in multiple independent power zones within the process chamber. In one embodiment, the power delivery mechanism includes a single power source, a first coil, a second coil, and a power distribution switch. The power distribution switch is arranged for selectively directing the energy of the single power source between the first and second coils. In this manner, the production of ions can be controlled at desired regions of the process chamber by switching between the two coils. In one embodiment, the two coils relate to the inner and outer regions of the process chamber, and more particularly to the center and edge of a substrate. In addition, parameters such as the magnitude and the duration of the switched power can be adjusted to further effect the production of ions in the two regions. Generally, as more power is applied to a given quantity of gas, greater ionization results. Also, when a given quantity of power is applied to a given quantity of gas for an extended period of time, greater ionization generally results.

For the neutrals, spatial separation can be accomplished by using a gas delivery mechanism that injects a process gas in multiple independent gas injection zones. In one embodiment, the gas delivery mechanism includes a single gas source, a first gas injection port or first set of ports, a second gas injection port or second set of ports, and a gas distribution switch. The gas distribution switch is arranged for selectively directing the gas flow of the gas source between the first and second gas injection ports. In this manner, the amount of neutrals can be controlled in desired regions of the process chamber by switching between the two ports alternately in time (time multiplexing). In one embodiment, the two ports relate to the inner and outer regions of the process chamber, and more particularly to the center and edge of a substrate.

Similarly to the above, parameters such as the magnitude (e.g., flow rate) and the duration of the switch can be varied to further affect the amount of gas in the two regions. Generally, a greater amount of neutrals can be found in the regions where the flow rate is increased and/or the flow is extended for a certain amount of time (time slice). Furthermore, in the case of the gas, the gas chemistry can be modified between each of the spatial zones or time slices to further effect the processing conditions. For example, a process gas consisting of ½ gas A and ½ gas B could be changed to a gas consisting of ⅓ gas A, ⅓ gas B and ⅓ gas C or their respective ratios could be changed to a gas consisting of ¾ gas A and ¼ gas B. As should be appreciated by those skilled in the art, different chemistries produce different processing results. That is, the chemistry can be changed to further increase/decrease the active reactants in the process chamber.

Embodiments of the invention are discussed below with reference to FIGS. 1–8. However, those skilled in the art will readily appreciate that the detailed description given herein with respect to these figures is for explanatory purposes as the invention extends beyond these limited embodiments.

FIG. 1 is a schematic diagram of a plasma reactor 10, in accordance with one embodiment of the present invention. Plasma reactor 10 includes a process chamber 12, a portion of which is defined by chamber walls 14, and within which a plasma 16 is both ignited and sustained for processing a substrate 18. Substrate 18 represents the work piece to be processed, which may represent, for example, a semiconductor substrate to be etched or otherwise processed or a glass panel to be processed into a flat panel display. In the illustrated embodiment, the process chamber 12 is arranged to be substantially cylindrical in shape, and the chamber walls are arranged to be substantially vertical. It should be understood, however, that the present invention is not limited to the above and that various configurations of the process chamber, including the chamber walls, may be used.

In most embodiments, the substrate 18 is introduced into the process chamber 12 and disposed on a pedestal 20, which is configured for supporting and holding the substrate 18 during processing. The pedestal 20 generally includes a bottom electrode 22, an edge ring 24, and a chuck 26. In one embodiment, the bottom electrode 22 is biased by an RF power supply 28 via a matching network 29. The RF power supply 28 is configured to supply the bottom electrode 22 with RF energy. In most cases, the electrode/power supply arrangement is configured for generating an electric field that is sufficiently strong to couple energy through the chuck 26, the edge ring 24, and the substrate 18. By way of example, the energy generated by the bottom electrode 22 may be arranged to form a sheath voltage, between the surface of the substrate 18 and the plasma 16, that is used to accelerate the ions in the plasma 16 towards the substrate 18. Furthermore, although the electrode is shown and described as being coupled to the RF power supply, it should be understood that other configurations may be used to accommodate different process chambers or to conform to other external factors necessary to allow the coupling of energy. For example, in some single frequency plasma reactors the pedestal may be coupled to ground.

With regards to the edge ring 24, the edge ring 24 is arranged to improve the electrical and mechanical properties of processing near the substrate's edge, as well as to shield the bottom electrode 22 and the chuck 26 from the reactants (i.e., ion bombardment). As such, the edge ring 24 is arranged to surround the edge of the substrate 18 and is disposed above the bottom electrode 22 and around the chuck 26. In most cases, the edge ring 24 is configured to be a consumable part that is replaced after excessive wear. The edge ring 24 may be formed from a suitable dielectric material such as silicon, silicon dioxide, silicon nitride, silicon carbide, quartz (e.g., a form of $SiO_2$), ceramic (e.g., $Al_2O_3$) and the like.

With regards to the chuck 26, the chuck 26 is coupled to the upper surface of the bottom electrode 22 and is generally configured for receiving the backside of the substrate 18 when the substrate 18 is placed on the pedestal 20 for processing. In the illustrated embodiment, the chuck 26 represents an ESC (electrostatic) chuck, which secures the substrate 18 to the chuck's surface by electrostatic force. However, it should be understood that a mechanical type chuck may also be used. In some embodiments, a helium cooling gas may also be delivered to the back side of the substrate and/or the back side of the edge ring to help control the temperatures of the substrate and edge ring during processing thereby ensuring uniform and repeatable processing results.

Additionally, the pedestal 20 is arranged to be substantially cylindrical in shape and axially aligned with the process chamber such that the process chamber and the pedestal are cylindrically symmetric. However, it should be noted that this is not a limitation and that the pedestal placement may vary according to the specific design of each plasma processing system. The pedestal may also be configured to move between a first position (not shown) for loading and unloading the substrate 18 and a second position (as shown) for processing the substrate 18. Alternatively, a push pin may be used to move the substrate 18 from a first position for loading/unloading to a second position for processing the substrate 18. These types of transport systems are well known in the art and for the sake of brevity will not be discussed in greater detail.

Moreover, an exhaust port 30 is disposed between the chamber walls 14 and the pedestal 20. The exhaust port 30 is configured for exhausting gases formed during processing, and is generally coupled to a turbomolecular pump (not shown), located outside of the process chamber 12. In most embodiments, the turbomolecular pump is arranged to maintain the appropriate pressure inside the process chamber 12. Furthermore, although the exhaust port is shown disposed between the chamber walls and the pedestal, the actual placement of the exhaust port may vary according to the specific design of each plasma processing system. For example, the exhausting of gases may also be accomplished from ports built into the walls of the process chamber.

Outside process chamber 12, and more particularly outside a dielectric window 32, there is disposed a power delivery mechanism 34 for distributing energy sufficiently strong to ignite and sustain the plasma 16 inside the process chamber 12. The power delivery mechanism 34 includes a single RF power supply 36, an inductive electrode 38, and a power distribution switch 40. The RF power supply 36 is configured for supplying the inductive electrode 38 with RF energy via a match network 37, and the inductive electrode 38 is configured for producing an electric field inside the process chamber 12. In accordance with one embodiment, the inductive electrode 38 is broken up into a plurality of individual and spatially distinct coils. In the illustrated embodiment, the inductive electrode 38 is broken up into an inner coil 38A and an outer coil 38B. The inner coil 38A is arranged to produce an electric field inside an inner process zone 42 of the process chamber 12, while the outer coil 38B is arranged to produce an electric field inside an outer process zone 44 of the process chamber 12. As should be appreciated, the inner process zone 42 generally corresponds to an inner region 46 (or center) of the substrate 18, and the outer process zone 44 generally corresponds to an outer region 48 (or outer edge) of the substrate 18. Accordingly, the inner coil 38A generally controls the formation of ions and reactive neutrals above the inner region 46 of the substrate 18, and the outer coil 38B generally controls the formation of ions and reactive neutrals above the outer region 48 of the substrate 18.

Each of the coils 38A, 38B is separately coupled to the RF power supply 36 and match network 37 through the power distribution switch 40. The power distribution switch 40 is arranged for directing the energy, from the RF power supply 36, between the inner coil 38A and the outer coil 38B. That is, the power distribution switch 40 is configured with a first position for directing energy to the inner coil 38A and a second position for directing energy to the outer coil 38B. Thus, depending on the position of the power distribution switch 40, either the inner coil 38A or the outer coil 38B is coupled to the RF power supply 36. The power distribution switch 40 is also in communication with a controller 75 via a signal connection 76. In one embodiment, the controller 75 is arranged to inform the power distribution switch 40 when to move from the first position to the second position (or vice versa), and/or how long to remain at a position before moving to another position. The controller 75 is also arranged for controlling a variety of operations associated with the power supply including but not limited to, controlling the magnitude (e.g., watts) of the RF power supply 36. As shown, the controller 75 is coupled to the power supply 36 via a signal connection 77. A spatial distribution switch will be described in greater detail in FIGS. 2 & 3.

The plasma reactor 10 also includes of a gas injection mechanism 50 for distributing process gases into the process chamber 12. The gas injection mechanism 50 generally includes a single gas box 52, a gas injection port 54 and a gas distribution switch 56. The gas box 52 is configured for delivering gaseous source materials to the gas injection port 54 (via a gas line 58), and the gas injection port 54 is configured for releasing the gaseous source materials into process chamber 12, and more particularly into the RF-induced plasma region between the dielectric window 32 and the substrate 18. As shown, the gas injection port 54 is disposed around the inner periphery of the process chamber 12, and more particularly through the dielectric window 32 (or gas distribution plate). Alternatively, the gaseous source materials may be released from ports built into the walls of the process chamber itself or through a shower head arranged in the dielectric window. Furthermore, the gas box 52 typically includes a gas flow controller system (not shown in FIG. 1) that is arranged for controlling the flow rate, the types of gaseous source materials to be used, and the ratios of the gaseous source materials. The gas box 52 is generally coupled to a plurality of gas cylinders (not shown), which are arranged to supply a variety of gaseous source materials, via a plurality of external gas lines 60. Gaseous source materials are well known in the art and will not be discussed in detail here.

In accordance with one embodiment, the gas injection port 54 is divided into a plurality of individual and spatially distinct ports. In the illustrated embodiment, the gas injection port 54 consists of an inner port 54A and an outer port 54B. The inner port 54A is arranged to release gaseous source materials into the inner process zone 42 of the process chamber 12, while the outer port 54B is arranged to release gaseous source materials into the outer process zone 44 of the process chamber 12. As mentioned, the inner process zone 42 generally corresponds to an inner region 46 of the substrate 18, and the outer process zone 44 generally corresponds to an outer region 48 of the substrate 18. As such, the inner port 54A generally controls the amount of neutrals above the inner region 46 of the substrate 18, and the outer port 54B generally controls the amount of neutrals above the outer region 48 of the substrate 18.

Each of the ports 54A, 54B is separately coupled to the gas box 52 through the gas distribution switch 56. The second distribution switch 56 is arranged for directing the gaseous source material, supplied from the gas box 52, between the inner port 54A and the outer port 54B. That is, the gas distribution switch 56 is configured with a first position for directing the gaseous source material to the inner port 54A and a second position for directing the gaseous source material to the outer port 54B. Thus, depending on the position of the gas distribution switch 56, either the inner port 54A or the outer port 54B is coupled to the gas box 52. The second distribution switch 56 is also in communication with the controller 75 via a signal connection 78. In one embodiment, the controller 75 is arranged to inform the gas distribution switch 56 when to move from the first position to the second position (or vice versa), and/or how long to remain at a position before moving to another position. The controller 75 is also coupled to the gas box 52 via a signal connection 79. The controller 75 is arranged for controlling a variety of operations associated with the gas box 52, including but not limited to, controlling the flow rate and the gas flow ratio of each of the gases in the gaseous source material mixture. Again, a spatial distribution switch will be described in greater detail in FIGS. 2 & 3.

Briefly, in order to create the plasma 16, a process gas (e.g., a single gaseous source material or a mixture of gaseous source materials) is generally input into the process chamber 12 through at least one of the gas injection ports 54. Power is then supplied to at least one of the electrodes 38 using RF power source 36, and a large electric field is produced inside the process chamber 12. The electric field accelerates the small number of electrons present inside the process chamber 12 causing them to collide with the gas molecules of the process gas. These collisions result in ionization and initiation of the plasma 16. As is well known in the art, the neutral gas molecules of the process gas when subjected to these strong electric fields lose electrons, and leave behind positively charged ions. As a result, positively charged ions, negatively charged electrons and neutral gas molecules are contained inside process chamber 12.

During the formation of the plasma 16, neutral gas molecules inside the process chamber 12 also tend to be directed towards the surface of the substrate. By way of example, one of the mechanism contributing to the presence of the neutral gas molecules at the substrate may be diffusion (i.e., the random movement of molecules inside the chamber). Thus, a layer of neutral species (e.g., neutral gas molecules) may typically be found along the surface of substrate 18. Correspondingly, when the bottom electrode 22 is powered, ions tend to accelerate towards the substrate 18 where they, in combination with neutral species, activate substrate processing, i.e., etching or deposition.

As should be appreciated, both the power delivery mechanism and the gas delivery mechanism shown in FIG. 1 can be used to enhance process uniformity. By way of example, the power delivery mechanism can be used to spatially change the ion density inside the process chamber by switching between the inner and outer coils, while the gas delivery mechanism can be used to spatially change the neutral density inside the process chamber by switching between inner and outer gas injection ports. Additionally, the magnitudes, the switching duration's, the constituents, and the constituent ratios can also be changed between time slices to further change the ion and neutral densities. Accordingly, several examples associated with enhancing process uniformity along the surface of a substrate will now be discussed.

In accordance with one aspect of the present invention, the ion density near the substrate edge is increased or decreased to improve processing uniformity between the center and edge of the substrate. This can be accomplished in a variety of ways using the inventive features of the present invention. By way of example, one approach to increasing the ions near the edge of the substrate is to increase the amount of time that the power is distributed at the outer zone relative to the amount of time that the power is distributed at the inner zone. Conversely, the amount of time can be decreased to decrease the ions near the edge of the substrate. It should be noted, however, that the time needed in the outer zone may be smaller than the amount of time needed at the inner zone because the ions formed in the inner zone may diffuse towards the outer zone. Another approach to increasing the ions near the edge of the substrate is to increase the amount of power distributed at the outer zone relative to the amount of power distributed at the inner zone. Conversely, the amount of power can be decreased to decrease the ions near the edge of the substrate.

In accordance with one aspect of the present invention, the ion density near the center of the substrate is increased or decreased to improve processing uniformity between the center and edge of the substrate. Again, this can be accomplished in a variety of ways using the inventive features of the present invention. By way of example, one approach to increasing the ions near the center of the substrate is to increase the amount of time that the power is distributed at the inner zone relative to the amount of time that the power is distributed at the outer zone. Conversely, the amount of time can be decreased to decrease the ions near the center of the substrate. It should be noted, however, that the time needed in the outer zone may be smaller than the amount of time needed at the inner zone because the ions formed in the inner zone may diffuse towards the outer zone. Another approach to increasing the ions near the center of the substrate is to increase the amount of power distributed at the inner zone relative to the amount of power distributed at the outer zone. Conversely, the amount of power can be decreased to decrease the ions near the center of the substrate.

In accordance with another aspect of the present invention, the neutral density ear the substrate edge is increased or decreased to improve the processing uniformity between the center and edge of the substrate. This can be accomplished in a variety of ways using the inventive features of the present invention. By way of example, one approach to increasing the neutrals near the edge of the substrate is to increase the amount of time that the gas is distributed at the outer zone relative to the amount of time that the gas is distributed at the inner zone. Conversely, the amount of time can be decreased to decrease the neutrals near the edge of the substrate. It should be noted, however, that the time needed in the outer zone may be smaller than the amount of time needed at the inner zone because the neutrals formed in the inner zone may diffuse towards the outer zone. Another approach to increasing the neutrals near the edge of the substrate is to increase the flow rate of the gas distributed at the outer zone relative the flow rate of the gas distributed at the inner zone. Conversely, the flow rate can be decreased to decrease the neutrals near the edge of the substrate. Another approach to increasing the neutrals near the edge of the substrate is to use a gas with a different chemical make-up at the outer zone relative to the chemical make-up of the gas distributed at the inner zone. This may be accomplished by changing the gas ratios of the component gases or by adding/deleting a component gas.

In accordance with another aspect of the present invention, the neutrals near the center of the substrate is increased or decreased to improve process uniformity. Again, this can be accomplished in a variety of ways using the inventive features of the present invention. By way of example, one approach to increasing the neutrals near the center of the substrate is to increase the amount of time that the gas is distributed at the inner zone relative to the amount of time that the gas is distributed at outer zone. Conversely, the amount of time can be decreased to decrease the neutrals near the center of the substrate. Another approach to increasing the neutrals near the center of the substrate may be to increase the flow rate of the gas distributed at the inner zone relative to the flow rate of the gas distributed at the outer zone. Conversely, the flow rate can be decreased to decrease the neutrals near the center of the substrate. Another approach to increasing the neutrals near the center of the substrate is to use a gas with a different chemical make-up at the inner zone relative to the chemical make-up of the gas distributed at the outer zone. This may be accomplished by changing the gas ratios of the component gases or by adding/deleting a component gas.

While this invention has been described in terms of several examples, it should be noted that there are alterations, permutations, and equivalents, which fall within the scope of this invention. For example, although the aforementioned examples were explained in context of a single parameter change it should be noted that multiple parameter changes could be done to further effect process uniformity, whether at the same time or at different times. By way of example, both the magnitude and duration of a component could be changed at the same time. Furthermore, it should be noted that component overlap could also be done to further effect process uniformity, whether at the same time or at different times. For example, during a gas step, a power step may be started, or vice versa, during a power step, a gas step may be started. The power step and the gas step could also be started at the same time.

FIG. 2 is a diagram of a spatial distribution switch 80 that could be used in either the power delivery mechanism 34 or the gas delivery mechanism 50. By way of example, the spatial distribution switch 80 may be the power distribution switch 40 or the gas distribution switch 56 of FIG. 1. In general, the spatial distribution switch 80 has an input 82 for receiving a supplied component 83 from the component source (not shown), and a first output 84 and a second output 86 for discharging a distributed component 83'. As illustrated in FIG. 2, the spatial distribution switch 80 has the capability of distributing the supplied component 83, to either the first output 84 or the second output 86. The first output 84 may be coupled to a component output for outputting the component into a first region of the process chamber, and the second component output 86 may be coupled to a second component output for outputting the component into a second region of the process chamber.

Briefly, the supplied component 83 may consist of a single constituent or a plurality of constituents. For example, in the case of a supplied gas, the supplied gas may consist of a single gas or a plurality of mixed gases. The supplied component 83 may also have varying properties associated with the component. For example, in the case of supplied energy, the supplied energy may have increased or decreased power. In the case of supplied gas, the supplied gas may have increased or decreased gas flow, different ratios of mixed gases, or a different gas mixture altogether. The supplied component 83 is preferably delivered via a single source (not shown), which is arranged for adjusting the properties and constituents associated with the supplied component throughout the process. Alternatively, a plurality of sources could be used to supply component(s) to the input 82 of switch 80. For example, a first source could be used to supply a first component to the switch, and a second source could be used to supply a second component to the switch. However, it should be noted that the cost of multiple sources is prohibitively high, and therefore one source is generally desired.

Figure 2A:
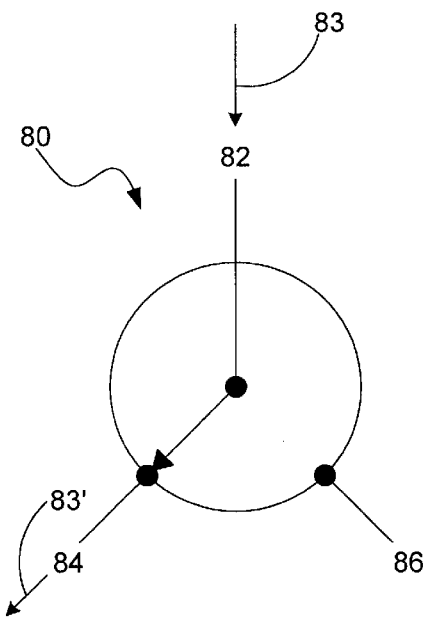
FIGS. 2A & B are diagrams of a spatial distribution switch, in accordance with one embodiment of the present invention.
Figure 2B:
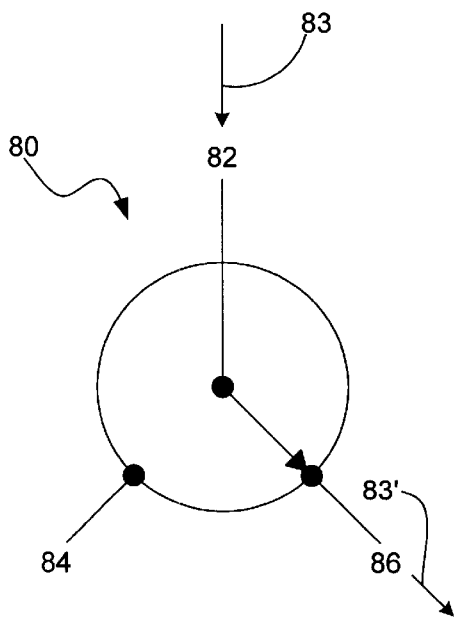
FIG. 2C is an exemplary time verses direction diagram showing the operation of a switch as a function of time, in accordance with one embodiment of the present invention.

To elaborate further, the spatial distribution switch 80 is essentially a Y switch, which by definition is a switch with one input and two outputs. The direction of the component depends on the condition of the spatial distribution switch 80. As the spatial distribution switch 80 is changed from a first condition (as shown in FIG. 2A) to a second condition (as shown in FIG. 2B), the direction of the component changes from the first output 84 to the second output 86. This arrangement when designed correctly produces a steady distribution of the component minimizing transients, first in one direction for a period of time (as determined by how long the switch is in condition A); and then in the reverse direction for a period of time (as determined by how long the switch is in condition B). Furthermore, the switch 80 is continuously modulated between these conditions throughout a single process in order to process a substrate uniformly.

In one implementation, the spatial distribution switch 80 is formed from a pair of valves or switches having one input and one output. In this particular embodiment, a first valve is coupled between the single source and the first zone and a second valve is coupled between the single source and the second zone. The component is distributed to the desired location by closing (off) one of the valves while opening (on) the other valve. For instance, in order to distribute the component to the first zone, the first valve is opened and the second valve is closed. Conversely, in order to distribute the component to the second zone, the first valve is closed and the second valve is opened. Although the switch has been shown and described with one input and two outputs, it should be understood that this is not a limitation and that the switch may be arranged to handle more outputs (or more inputs). For example, a switch having one input and three outputs could be used to distribute a component between three sectors of the process chamber. In this case, three valves may be used to distribute the component to the appropriate sector.

Furthermore, although the switch has been shown and described in context of power and gas delivery mechanisms, it should be known that the concepts could be applied to other components as well. For example, the switch may be used in component delivery mechanisms utilizing components such as temperature, bias power, magnetism and the like. As should be appreciated, each component delivery system provides increased recipe control.

Figure 2C:
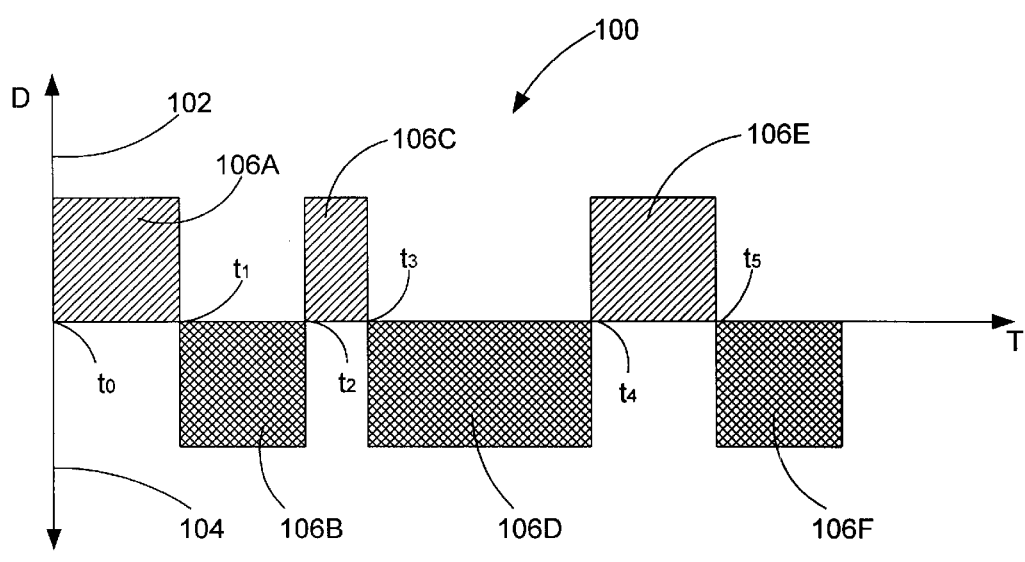

To further elaborate, FIG. 2C depicts an exemplary time verses direction diagram 100 showing the operation of a switch as a function of time, in accordance with one embodiment of the present invention. As shown, the diagram 100 includes a time axis, T, and a directional axis, D. The directional axis, D, is divided into two distinct directions 102 and 104. By way of example, the directions 102 and 104 may respectively correspond to the first output 84 and the second output 86 of FIGS. 2A & B. Furthermore, the time axis, T, is divided into a plurality of distinct time sequences 106A–F, which start at various times, $t_{0-5}$. As should be appreciated, not only are the components being spatially modulated between directions 102 and 104, but they are also being time modulated between times $t_{0-5}$. That is, the switch is alternating directions at specific times in the process. The time sequences 106 may or may not be equal. For example as shown in FIG. 2C, time sequences 106A, 106B, 106E and 106F are performed for the same amount of time, while time sequence 106C and 106D are performed for different amounts of time. More specifically, time sequence 106C is performed for a shorter length of time, while time sequence 106D is performed for a longer length of time. As such, the direction (e.g., 102, 104), the timing (e.g., $t_{0-5}$) and the amount time (e.g., 106) can be adjusted throughout the process to enhance process uniformity.

Figure 3:
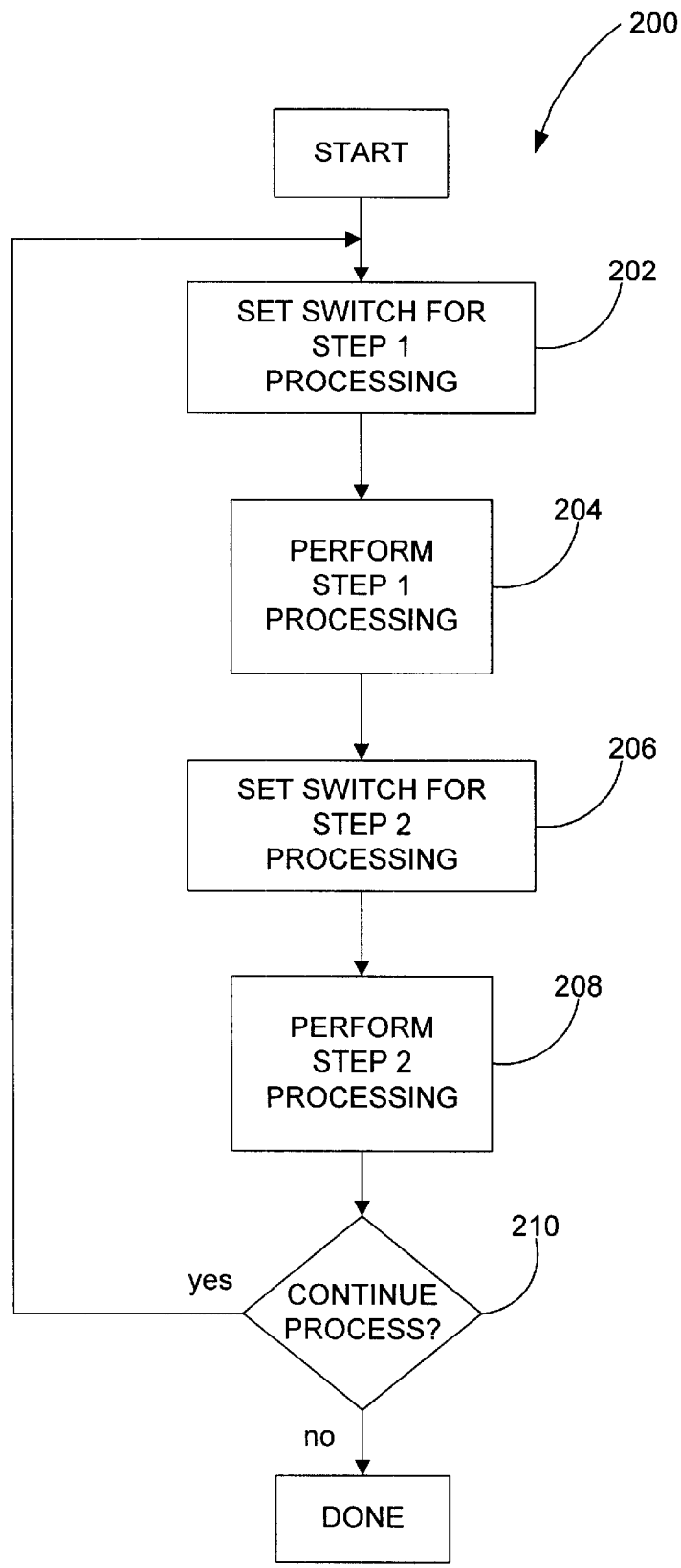
FIG. 3 is a flow diagram of the operations associated with a switch of the component delivery mechanism of FIG. 2, in accordance with one embodiment of the present invention.

FIG. 3 is a flow diagram of the operation of the switch 80 according to one embodiment of the invention. For ease of discussion, the flow diagram of FIG. 3 will be described in context of a pair of consecutive switches. It should be known, however, that this is not a limitation and that a plurality of switches may be made in a single process. The switching operation 200 generally begins at step 202. In step 202, the direction of the switch 80 is set for step I processing by a controller. That is, in step 202, the switch is changed from the first condition of FIG. 2A to the second condition of FIG. 2B (or vice versa) thereby directing the distribution of the component from a first output zone to a second output zone (or vice versa). After the direction is set in step 202, the process flow proceeds to step 204 where step 1 processing is performed. Step 1 processing generally includes a predetermined recipe (or instructions) for the component delivery mechanism to follow. For example, with regards to the power, the magnitude of the distributed power and the distribution time may be set to a predetermined value. With regards to the gas flow, the flow rate, the distribution time, the gas chemistry, and the gas ratios may be set to a predetermined value. These predetermined values may be lower, higher, or the same as the predetermined values in the other zone(s). In one example, the predetermined values may be determined in an experimental process, through trial and error, to produce a process that is steady and uniform.

Following step 1 processing, the process flow proceeds to step 206 where the direction of the switch 80 is set for step 2 processing by a controller. In step 206, the switch 80 is changed from the second condition of FIG. 2B to the first condition of FIG. 2A (or vice versa) thereby directing the distribution of the component from the second output zone to the first output zone (or vice versa). After the direction is set in step 206, the process flow proceeds to step 208 where step 2 processing is performed. Similar to step 1 processing, step 2 processing generally includes a predetermined recipe (or instructions) for the component delivery system to follow. Following step 2 processing, the process flow proceeds to step 210 where a decision is made to continue processing (yes) or end processing (no). If the decision is to continue processing then the process flow proceeds back to step 202. If the decision is to end processing then the process flow proceeds to step 212, which signifies that the process is done.

Figure 4:
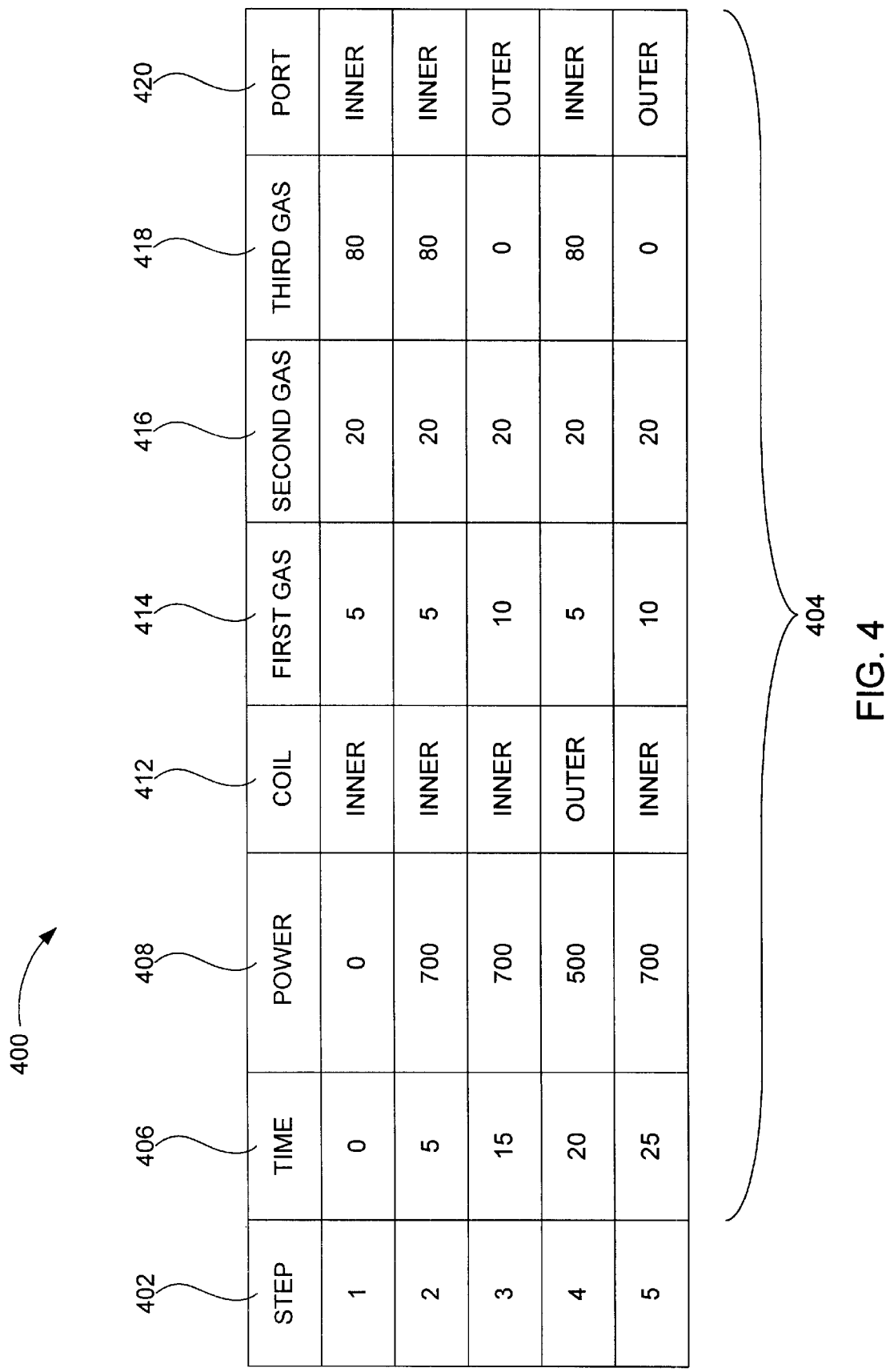
FIG. 4 is a table illustrating a partial recipe set-up, in accordance with one embodiment of the present invention.

To elaborate further, an exemplary application of this invention will now be described with respect to FIG. 4. FIG. 4 is a table illustrating a partial recipe set-up 400 for an aluminum metalization etch process, in accordance with one embodiment of the present invention. By way of example, the recipe may be used in a plasma reactor similar to the plasma reactor described above with respect to FIG. 1. The partial recipe set-up 400 generally includes a plurality of steps 402 and a plurality of parameters 404, which may be adjusted throughout the process, and more particularly at each of the steps 402, to produce uniform etch results from the center to the edge of a substrate. The parameters in this example include, but are not limited to, a time 406, an electrode power 408, an coil position 412, a first gas flow rate 414, a second gas flow rate 416, a third gas flow rate 418 and a gas flow inlet position 420.

The time 406 is associated with the time at which a step in steps 402 takes place and thereby controls the duration of each step. The electrode power 408 is associated with the power (e.g., watts) delivered to the top electrode, whether the inner or outer coil. The coil position 412 is associated with the direction, i.e., inner or outer coil, of the delivered power. The first gas flow rate 414 is associated with the flow rate (e.g., sccm) of a first gas, which is part of the main processing gas. The second gas flow rate 416 is associated with the flow rate of a second gas, which is part of the main processing gas. The third gas flow rate 418 is associated with the flow rate of a third gas, which is part of the main processing gas. By way of example, the first gas may be $CHF_3$, the second gas may be $BCl_3$ and the third gas may be $Cl_2$. The gas flow inlet position 420 is associated with the direction, i.e., inner or outer gas injection port, of the delivered gases.

The process begins at step 1 where the main process gas is inputted into the process chamber. As shown, the main process gas has a gas flow ratio of May 20, 1980 and is delivered to the inner gas injection port. Step 1 processing continues for 5 seconds (e.g., starting at time=0, ending at time=5). Following step 1, the process proceeds to step 2 where the inner coil of the top electrode is powered to 700 watts, and the main process gas, having the same gas ratio May 20, 1980, continues to flow to the inner gas injection port. Step 2 processing continues for 10 seconds (e.g., starting at time=5, ending at time=15).

After the completion of step 2, the process proceeds to step 3 where the 700 watt power continues to be applied to the inner coil of the top electrode, and the main process gas, having a new gas ratio Oct. 20, 2000, changes direction and begins to be delivered to the outer gas injection port. Step 3 processing continues for 5 seconds (e.g., starting at time=15, ending at time=20). Following step 3, the process proceeds to step 4 where the distributed power, having a new power setting of 500 watts, changes direction and begins to be applied to the outer coil of the top electrode. In addition, the main process gas, having a new gas ratio May 20, 1980, changes direction and begins to be delivered to the inner gas injection port. Step 4 processing continues or 5 seconds (e.g., starting at time=20, ending at time=25). After the completion of step 4, the process proceeds to step 5 where the distributed power, having a new power setting of 700 watts, changes direction and begins to be applied to the inner coil of the top electrode. In addition, the main process gas, having a new gas ratio Oct. 20, 2000, changes direction and begins to be delivered to the outer gas injection port.

Although this example is directed at an Al etch process it should be appreciated that the recipe could be changed to etch process other metals as well. Furthermore, the recipe could be changed to etch process other materials including dielectrics. As such, the main process gas may consist of other types of gases and/or other gas flow rates and ratios, and the power may be adjusted to different power levels. Additionally, although the direction of power and gas changed during the aforementioned process, it should be noted that one of these components could remain the same while the other changes. It should also be noted that the time could change for each process, and that increments of 5 or 10 seconds is not a limitation. Moreover, both the power and the gas flow could follow different time scales such that they change at different times during the process. In addition it should be noted that by partial, in partial recipe 400, it is meant that the recipe is only a portion of an entire recipe. On a similar note, it should be noted that 5 process steps is not a limitation and that more or less steps can be conducted to process a substrate.

Figure 5:
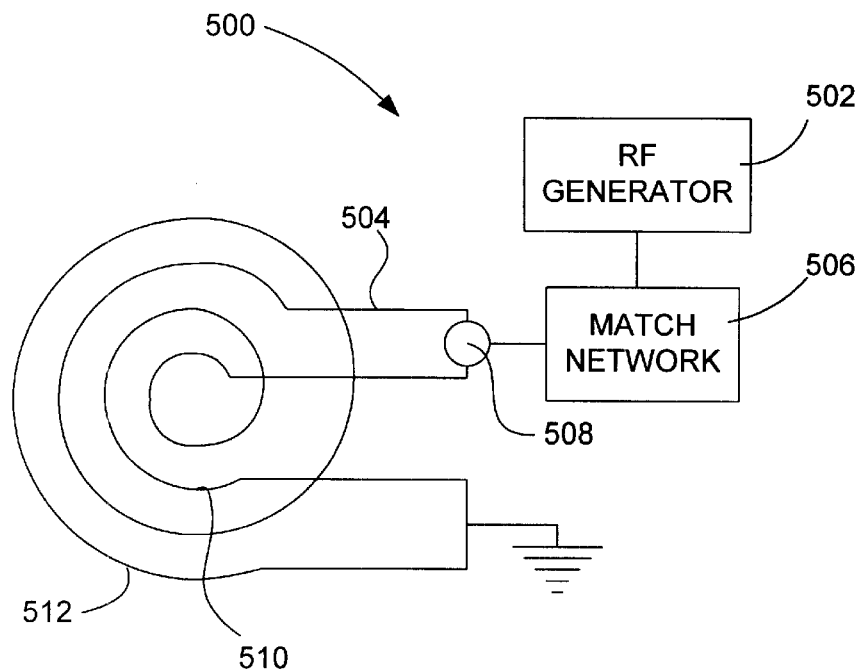
FIG. 5 is a diagram of a power delivery mechanism, in accordance with one embodiment of the present invention.

FIG. 5 is a diagram of a power delivery mechanism 500, in accordance with one embodiment of the present invention. By way of example, the power delivery mechanism 500 may respectively correspond to the power delivery system 34 illustrated in FIG. 1. The power delivery mechanism 500 generally includes an RF supply (or generator) 502, an electrode 504, a match network 506, and a high powered RF switch 508. The electrode 504 includes two coils, and more particularly an inner coil 510 and an outer coil 512, which are electrically coupled to the RF power supply 502 via the high powered RF switch 508. Although the coils are shown as two concentric coils, it should be noted that this is not a limitation. As a function of time during the process, each of the coils may be switched to the RF power supply 502 thereby changing spatially where the RF power is coupled. In one implementation, the high powered RF switch is configured to be fast compared to the time the plasma settles, which is typically on the order of milliseconds. By switching fast, the substrate tends to see some composite average of the delivered power. Switching rates depend on the specifics of the design, but rates from 0.1 Hz to 100 Hz would be common. The power distribution switch may also be arranged to work on a kHz time scale. Furthermore, the match network 506 is generally disposed between the high powered RF switch 508 and the RF power supply 502. The match network 506 is arranged to match the impedance between the output of the RF power supply 502 and the plasma load.

In most cases, when the system switches coils, the impedance of the system changes. That is, the impedance produced at the inner coil is generally different than the impedance produced at the outer coil. As such, the match network 506 needs to be able to adjust rapidly or the system has to be designed in such a way that it doesn't have to adjust at all.

In one embodiment, the match network 506 is a fixed match network. That is, the match network is designed having a set impedance between the power supply and the plasma load. In one implementation, the fixed match network is arranged to match the impedance between the power supply and the plasma load generated by the inner coil. In this implementation, the power delivered to the outer coil is increased to compensate for the reflected power generated by the impedance mismatch at the outer coil. In another implementation, the fixed match network is arranged to match the impedance between the power supply and the plasma load generated by the outer coil. In this implementation, the power delivered to the inner coil is increased to compensate for the reflected power generated by the impedance mismatch at the inner coil.

In another implementation, the fixed match network is arranged to have two conditions. One condition matching the impedance between the power supply and the plasma load generated by the inner coil, and another condition matching the impedance between the power supply and the plasma load generated by the outer coil. In this implementation, the match network is arranged to switch between impedance's to match the impedance generated by each of the distinct coils. In yet another implementation, the inner and outer coils are arranged to have similar impedance's such that the match network is arranged to match the impedance between both the inner and outer coils.

In another embodiment, the match network 506 is a tunable match network that is configured to match the impedance under widely changing load impedance conditions. For example, the tunable match network is capable of matching the impedance for a wide variety of changing parameters including, but not limited to, power direction, power magnitude, power time, gas flow rate, chamber pressure, chamber temperature and the like. The tunable match network generally includes a wattmeter (not shown) arranged for determining both forward and reflected power. As is well known in the art, reflected power is evidence that there is a mismatch between the output impedance of the generator and the plasma load. Accordingly, the wattmeter is arranged to determine if the impedance of the system has changed. Upon determining that a change has occurred, the tunable match network can adjust to match the changed impedance.

Figure 6:
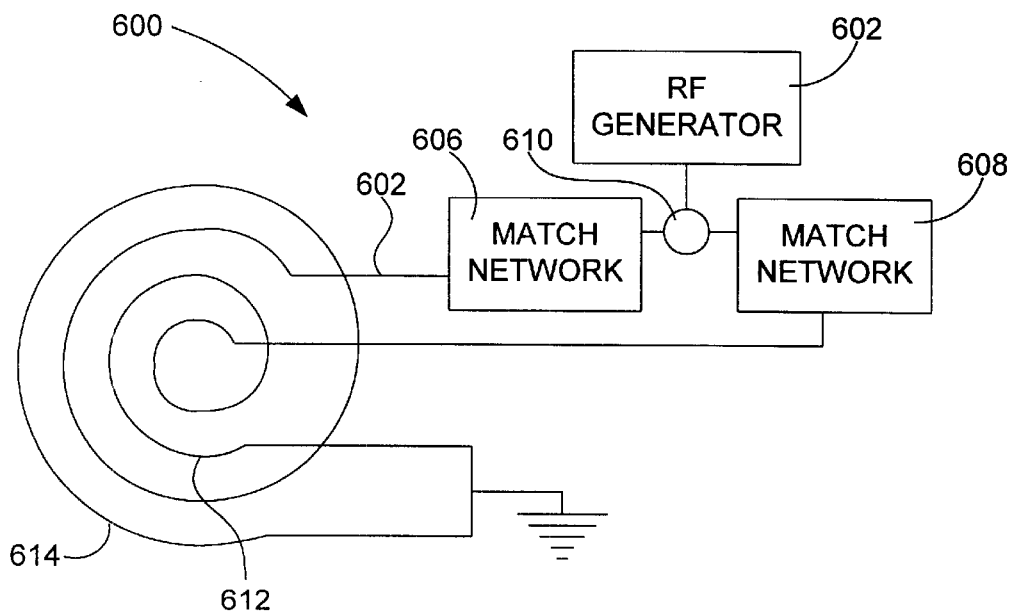
FIG. 6 is a diagram of a power delivery mechanism, in accordance with one embodiment of the present invention.

FIG. 6 is a diagram of a power delivery mechanism 600, in accordance with one embodiment of the present invention. By way of example, the power delivery mechanism 600 may respectively correspond to the power delivery mechanism 34 illustrated in FIG. 1. The power delivery mechanism 600 is generally used if the plasma and coil impedance's differ substantially. The power delivery mechanism 600 generally includes an RF power supply (or generator) 602, an electrode 604, a first match network 606, a second match network 608 and a high powered RF switch 610. The electrode 604 includes two coils, and more particularly an inner coil 612 and an outer coil 614, which are electrically coupled to the RF power supply 602 via the high powered RF switch 610. Although the coils are shown as two concentric coils, it should be noted that this is not a limitation. As a function of time during the process, each of the coils may be switched to the RF power supply 602 thereby changing spatially where the RF power is coupled. In one implementation, the high powered RF switch is configured to be fast compared to the time the plasma settles. By switching fast, the substrate tends to see some composite average of the delivered power. Furthermore, the first match network 606 is generally disposed between the outer coil 614 and the high powered RF switch 610, and the second match network 608 is generally disposed between the inner coil 612 and the high powered RF switch 610. With regards to the first match network 606, the first match network 606 is arranged to match the impedance between output of the RF power supply 602 and the plasma load created by using the outer coil 614. With regards to the second match network 608, the second match network 608 is arranged to match the impedance between output of the RF power supply 602 and the plasma load created by using the inner coil 612. In one embodiment, the first and second match networks are tunable match networks (as described above). In another embodiment, the first and second match networks are fixed match networks (also as described above).

FIG. 7 is a diagram of a gas delivery mechanism 700, in accordance with one embodiment of the present invention. By way of example, the gas delivery mechanism 700 may respectively correspond to the gas delivery mechanism 50 illustrated in FIG. 1. The gas delivery mechanism 700 generally includes a gas supply 702 (or gas box), a gas distribution plate 704, and a gas distribution switch 706. The gas distribution plate 704 includes two gas injection ports, and more particularly an inner gas injection port 708 and an outer gas injection port 710, which are coupled to the gas box 702 via the gas distribution switch 706. The gas supply 702 feeds gas to the gas distribution switch 706 through a first gas line 712, and the switch, depending on the switch condition, supplies gas to either a second gas line 714 or a third gas line 716. As shown, the second gas line 714 delivers gas to the inner gas injection port 708 and the third gas line 716 delivers gas to the outer gas injection port 710. As a function of time during the process, each of the ports may be switched to the gas supply 702 thereby changing spatially where the gas is distributed. Furthermore, although not shown in FIG. 7, both of the gas injection ports may include a plurality of apertures for releasing the supplied gas. Generally, the apertures of the respective ports are interconnected such that only one gas line per port is needed. Gas distribution plates are conventional and generally well known in that art. However, in order to facilitate discussion of the present invention, a gas distribution plate will be described in greater detail in FIG. 8.

With regards to the gas box 702, the gas box 702 generally includes a high pressure gas manifold having a plurality gas inlet lines 716, which are connected to individual gas sources (not shown). By way of example, the gas sources may be gas bottles or gas cylinders. Although only four gas inlet lines are shown, it should be understood that this is not a limitation and that more or less gas inlet lines can be used. The standard amount of gases and therefore the standard amount of gas inlet lines is generally about 8. The gas inlet lines 716 are generally coupled to mass flow controllers 718, which are arranged for controlling and regulating the parameters associated with a distributing a gas including, but not limited to, gas flow rate, gas mixture, gas ratios and pressure. Each gas has its own mass flow controller. The mass flow controllers 718 generally include a valve (not shown) and a flow meter (not shown). The flow meter is for controlling how fast the gases flow through and thus the pressure, and the valve is for outputting a low pressure gas to a low pressure manifold 720. As shown, the low pressure manifold 720 includes tubing where the gases are mixed. As should be appreciated, by controlling each of the mass flow controllers, the gas chemistry, gas ratios and flow rate of the mixed gas can be adjusted. The mixture of gases are then fed to a valve 722 for releasing the mixed gases to the gas distribution switch 706 via the first gas line 712.

Upon reaching the switch 706, the gas mixture is directed to one of the two gas injection ports 708 or 710 via one of two switch conditions. If the switch 606 is in a first condition, the gas mixture flows to the inner gas injection port 708 via the second gas line 714. If the switch 706 is in a second condition, the gas mixture flows to the outer gas injection port 710 via the third gas line 716.

In some cases, switching transients may be encountered by switching between each of the above conditions. That is, the switching may cause the gas injection ports to release a non-constant or pulsed flow of gas. These switching transients may adversely effect the formation of the plasma or discharge and may lead to the back streaming of plasma gases into the gas lines or the build-up of particulate matter in the gas lines. There are many ways to account for these effects. For example, one way may be to lower the conductance of the gas flow through the gas lines. By lowering the conductance, a switch may be able to be made before the gas exhausts out of the gas line, and thus, a pseudo steady state of gas flow may be achieved. By way of example, one way to lower the conductance of the gas line may be to increase its length.

FIG. 8 depicts an exemplary gas distribution plate 800. By way of example, the gas distribution plate 800 may respectively correspond to the gas distribution plate 32 illustrated in FIG. 1. The gas distribution plate 800 generally includes an inner portion 802 and an outer portion 804. The inner portion 802 generally includes a plurality of inner apertures 806 for releasing a gas into an inner region of a process chamber. Each of the inner apertures 806 are interconnected to one another through channels in the gas distribution plate 800 and coupled to an inner gas injection port (not shown). Similarly, the outer portion 804 generally includes a plurality of outer apertures 808 for releasing a gas into an outer region of a process chamber. Each of the outer apertures 808 are interconnected to one another through channels in the gas distribution plate 800 and coupled to an outer gas injection port (not shown). Although a certain configuration is shown for the apertures 806 and 808, it should be noted that other configurations may be used. For example, a single aperture may be used in both the inner and outer portions. Gas distribution plates are well known in the art and for the sake of brevity will not be discussed in greater detail.

As can be seen from the foregoing, the present invention offers numerous advantages over the prior art. Different embodiments or implementations may have one or more of the following advantages. One advantage of the present invention is increased process control. By way of example, the present invention can be used to control the concentration of ions and neutrals at various locations within a plasma processing chamber. In order to achieve greater spatial control of the process, the present invention provides for spatially modulating the distribution of components among different locations within a process chamber for a programmable period of time. As a result of the increased control, uniform processing can be achieved to a greater degree than possible in the prior art. Another advantage of the present invention is reduced cost and complexity of the system. By providing a distribution switch, only one component source is needed and therefore the cost of the design is reduced.

While this invention has been described in terms of several preferred embodiments, there are alterations, permutations, and equivalents which fall within the scope of this invention. It should also be noted that there are many alternative ways of implementing the methods and apparatuses of the present invention. For example, although the component delivery mechanism is described and shown in terms of a plasma reactor for processing semiconductor substrates, it should be noted that other systems could apply the techniques and methods of the component delivery mechanism. For example, it is contemplated that the component delivery mechanism could be used in most semiconductor processing systems including chemical vapor deposition (CVD), thermal CVD, plasma enhanced chemical vapor deposition (PECVD), physical vapor deposition (PVD) such as sputtering and the like, as well as, dry etching, plasma etching, reactive ion etching (RIE), magnetically enhanced reactive ion etching (MERIE), electron cyclotron resonance (ECR), and the like. Furthermore, it is also contemplated that the component delivery mechanism could be applied to systems outside of semiconductor processing. For example, magnetic or optical storage disk manufacturing.

It is therefore intended that the following appended claims be interpreted as including all such alterations, permutations, and equivalents as fall within the true spirit and scope of the present invention.

What is claimed is:

1. A component delivery mechanism for distributing a component inside a process chamber, the component being used to process a work piece within the process chamber, the component delivery mechanism, comprising:

a plurality of component outputs for outputting the component to a desired region of the process chamber, the plurality of component outputs including at least a first component output arranged to output the component to a first region of the process chamber and a second component output arranged to output the component to a second region of the process chamber, the first region of the process chamber corresponding to a center portion of the work piece and the second region corresponding to an outer portion of the work piece; and a spatial distribution switch being arranged for directing the component to the plurality of component outputs, the spatial distribution switch having a first condition, directing the component to the first component output, and a second condition, directing the component to the second component output, the spatial distribution switch being arranged to perform time modulation between conditions so as to spatially distribute the component inside the process chamber during processing.

2. The component delivery mechanism as recited in claim 1 wherein the spatial distribution switch is arranged to stay in one condition for a predetermined amount of time to effect the concentration of the component inside the process chamber during processing.

3. The component delivery mechanism as recited in claim 1 wherein the component is a gaseous source material, wherein the single component source is a gas supply box for supplying the gaseous source material, and wherein the component outputs are gas injection ports for releasing the gaseous source material into the process chamber.

4. The component delivery mechanism as recited in claim 3 wherein the plurality of gas injection ports include at least a first gas injection port and a second gas injection port, and wherein the spatial distribution switch has a first condition, directing the gaseous source material to the first gas injection port, and a second condition, directing the gaseous source material to the second gas injection port.

5. The component delivery mechanism as recited in claim 4 wherein the first gas injection port is arranged to release the gaseous source material into a first region of the process chamber, and wherein the second gas injection port is arranged to release the gaseous source material into a second region of the process chamber.

6. The component delivery mechanism as recited in claim 5 wherein the first region of the process chamber corresponds to a center portion of the work piece, and wherein the second region of the process chamber corresponds to an outer portion of the work piece.

7. The component delivery mechanism as recited in claim 5 wherein the spatial distribution switch is arranged to modulate between conditions to spatially distribute the gaseous source materials between the first gas injection port and the second gas injection port thereby effecting the concentration of the gaseous source materials between the first and second region of the process chamber during processing.

8. The component delivery mechanism as recited in claim 1 wherein the component is energy, wherein the single component source is a power supply for supplying energy, and wherein the component outputs are electrode coils for producing an electric field inside the process chamber.

9. The component delivery mechanism as recited in claim 8 wherein the plurality of electrode coils include at least a first coil and a second coil, and wherein the spatial distribution switch has a first condition, directing the energy to the first coil, and a second condition, directing the energy to the second coil.

10. The component delivery mechanism as recited in claim 9 wherein the first coil is arranged to produce an electric field inside a first region of the process chamber, and wherein the second coil is arranged to produce an electric field inside a second region of the process chamber.

11. The component delivery mechanism as recited in claim 10 wherein the spatial distribution switch is arranged to modulate between conditions to spatially distribute the energy between the first coil and the second coil thereby effecting the concentration of the electric field between the first and second region of the process chamber during processing.

12. The component delivery mechanism as recited in claim 1 wherein the work piece is a semiconductor substrate.

13. The component delivery mechanism as recited in claim 1 wherein the component delivery mechanism is used in a plasma reactor to effect the amount of ions and neutrals inside the process chamber so as to uniformly process the work piece.

14. The component delivery mechanism as recited in claim 1 wherein the plurality of component outputs are distinct from one another such that they separately output the component to the process chamber.

15. The component delivery mechanism as recited in claim 14 wherein the spatial distribution switch selectively distributes the supplied component between the distinct component outputs.

16. The component delivery mechanism as recited in claim 15 wherein the spatial distribution switch distributes the component to only one of the distinct component outputs at given time.

17. The component delivery mechanism as recited in claim 1 further including a component source coupled to the spatial distribution switch, the single component source being arranged for supplying the component to the spatial distribution switch.

18. A component delivery mechanism for distributing a component inside a process chamber, the component being used to process a work piece within the process chamber, the component delivery mechanism, comprising:

a component source for supplying the component;

a spatial distribution switch having a single input for receiving the component from the component source, and at least a first output and a second output for discharging the component, the switch having at least a first condition, directing the component through the first output, and a second condition, directing the component through the second output;

at least a first component output and a second component output, the first component output being coupled to the first output of the spatial distribution switch, and the second component output being coupled to the second output of the spatial distribution switch, the first component output being arranged for outputting the component into an inner region of the process chamber, the second component output being arranged for outputting the component into an outer region of the process chamber, the first region of the process chamber corresponding to a center portion of the work piece and the second region corresponding to an outer portion of the work piece; and a controller for controlling the spatial distribution switch, the controller being configured for directing the spatial distribution switch between at least the first and second conditions, the controller performing time multiplexing with the spatial distribution switch so as to effect the concentration of the component in the inner and outer regions of the process chamber.

19. A component delivery mechanism for distributing a component inside a process chamber, the component being used to process a work piece within the process chamber, the component delivery mechanism, comprising:

a plurality of component outputs for outputting the component to a desired region of the process chamber, the plurality of component outputs including at least a first component output arranged to output the component to a first region of the process chamber and a second component output arranged to output the component to a second region of the process chamber, the first region of the process chamber corresponding to a center portion of the work piece and the second region corresponding to an outer portion of the work piece; and a spatial distribution switch being arranged for directing the component to the plurality of component outputs, the spatial distribution switch utilizing time modulation to direct the component to the first component output at a first time, and to direct the component to the second component output at a second time, wherein the component that is outputted into the process chamber via the component outputs and spatial distribution switch is part of a process recipe that is configured to ignite and sustain a plasma inside the process chamber.

20. The component delivery mechanism as recited in claim 19 wherein the spatial distribution switch selectively distributes the supplied component between the distinct outputs.

21. The component delivery mechanism as recited in claim 20 wherein the spatial distribution switch distributes the supplied component to only one of the distinct outputs at a given time.

22. A component delivery mechanism for distributing a plasma forming component inside a process chamber, the plasma forming component being used to process a work piece within the process chamber, the component delivery mechanism, comprising:

a spatial distribution switch for controlling the distribution of the plasma forming component into the process chamber so as to ignite and sustain a plasma inside the process chamber, the spatial distribution switch having an inlet for receiving the component from a component source configured for supplying the component, and at least two distinct outlets for separately delivering the component to at least two spatially distinct component outputs configured for outputting the component directly into the process chamber, the spatial distribution switch including a first outlet for delivering the component to a first component output configured for outputting the component directly into an inner region of the process chamber and a second outlet for delivering the component to a second component output configured for outputting the component directly into an outer region of the process chamber, the spatial distribution switch being configured to selectively distribute the received component between the first and second outlets via time multiplexing so as to effect the concentration of the component in the inner and outer region of the process chamber.

23. The component delivery mechanism as recited in claim 22 wherein the inlet is capable of coupling to a component source configured to output the component, and wherein the two distinct outlets are capable of coupling to two distinct component outputs for outputting the component to different regions of the process chamber.

24. A plasma reactor for processing a semiconductor substrate, comprising:

a process chamber in which a plasma is ignited and sustained for processing the semiconductor substrate, the process chamber including an inner process zone and an outer process zone, the inner process zone being positioned over an inner region of the semiconductor substrate, the outer process zone being positioned over an outer region of the semiconductor substrate;

a gas injection mechanism configured to distribute gaseous source materials into the process chamber, the gas injection mechanism comprising a single gas supply, a gas injection port and a gas distribution switch, the single gas supply being configured to deliver the gaseous source materials to the gas injection port, the gas injection port being configured to release the gaseous source materials into the process chamber, the gas injection port being divided into a plurality of individual and spatially distinct ports including at least an inner port arranged to release the gaseous source materials into the inner process zone of the process chamber and an outer port arranged to release the gaseous source materials into the outer process zone of the process chamber, the inner and outer ports being coupled to the single gas supply through the gas distribution switch, the gas distribution switch being configured to direct the gaseous source material supplied by the single gas supply to the inner or outer port, wherein the gaseous source materials are introduced into the process chamber through at least one of the ports in order to create the plasma inside the process chamber.

25. The plasma reactor as recited in claim 24 further comprising a power delivery mechanism configured to produce an electric field inside the process chamber, wherein the electric field accelerates the electrons present inside the process chamber causing them to collide with the gas molecules of the gaseous source material, and wherein the collisions result in the ionization and initiation of the plasma.

26. The plasma reactor as recited in claim 24 further comprising a pedestal for supporting the substrate during processing, the pedestal including a chuck configured for receiving the backside of the semiconductor substrate when the semiconductor substrate is placed on the pedestal for processing, the chuck being configured to hold the semiconductor substrate during processing, the pedestal also including an electrode arrangement arranged to form a sheath voltage between the surface of the substrate and the plasma, the sheath voltage being configured to accelerate species of the plasma towards the semiconductor substrate.

27. The plasma reactor as recited in claim 24 further comprising a controller for controlling the spatial distribution switch, the controller being configured for directing the spatial distribution switch between at least a first condition, directing the component through the inner port, and a second condition, directing the component through the outer port, so as to effect the concentration of the gaseous source material in the inner and outer process zones of the process chamber.

28. The plasma reactor as recited in claim 24 wherein the gas supply feeds the gaseous source material to the gas distribution switch through a first gas line, and the switch depending on the switch direction supplies the gaseous source material to either a second gas line or a third gas line, the second gas line being configured to deliver the gaseous source material to the inner port and the third gas line being configured to deliver the gaseous source material to the outer port.

29. The plasma reactor as recited in claim 24 wherein the gas injection port is formed in a gas distribution plate, and wherein each of the inner and outer ports includes a plurality of apertures for releasing the gaseous source material into their respective zones of the process chamber.

30. The plasma reactor as recited in claim 24 wherein the gas supply includes a high pressure gas manifold having a plurality of gas inlet lines, each which are connected to individual gas sources and mass flow controllers, the mass flow controllers being configured to control and regulate the parameters associated with distributing the gaseous source materials to the gas distribution switch.

* * * * *